US012494596B2

(12) United States Patent
Suzuki et al.

(10) Patent No.: US 12,494,596 B2
(45) Date of Patent: Dec. 9, 2025

(54) CIRCUIT CONNECTION DEVICE, ROTATING ELECTRIC MACHINE DEVICE, AND METHOD FOR MANUFACTURING CIRCUIT CONNECTION DEVICE

(71) Applicant: Mitsubishi Electric Corporation, Tokyo (JP)

(72) Inventors: Junya Suzuki, Tokyo (JP); Yoshihiko Onishi, Tokyo (JP); Isao Sonoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 150 days.

(21) Appl. No.: 18/566,441

(22) PCT Filed: Jul. 28, 2021

(86) PCT No.: PCT/JP2021/027830
§ 371 (c)(1),
(2) Date: Dec. 1, 2023

(87) PCT Pub. No.: WO2023/007599
PCT Pub. Date: Feb. 2, 2023

(65) Prior Publication Data
US 2024/0250457 A1 Jul. 25, 2024

(51) Int. Cl.
*H01R 12/58* (2011.01)
*H02K 5/22* (2006.01)
*H05K 1/02* (2006.01)

(52) U.S. Cl.
CPC ........... *H01R 12/585* (2013.01); *H02K 5/225* (2013.01); *H05K 1/0203* (2013.01); *H05K 2201/066* (2013.01); *H05K 2201/10189* (2013.01)

(58) Field of Classification Search
CPC .. H01R 12/585; H01R 2201/10; H01R 12/58; H01R 13/6658; H01R 31/00;
(Continued)

(56) References Cited

U.S. PATENT DOCUMENTS 6,007,348 A * 12/1999 Murphy ............. H01R 43/0235
439/70
7,114,996 B2 * 10/2006 Goodman .......... H01R 13/2421
439/700

(Continued)

FOREIGN PATENT DOCUMENTS

DE 102012017651 A1 * 3/2013 ......... H05K 7/20854
EP 3611830 A1 * 2/2020 ........... H02K 11/215
(Continued)

OTHER PUBLICATIONS

International Search Report for PCT/JP2021/027830 dated Oct. 5, 2021 [PCT/ISA/210].
(Continued)

*Primary Examiner* — Pedro J Cuevas
(74) *Attorney, Agent, or Firm* — Sughrue Mion, PLLC

(57) ABSTRACT

A circuit connection device includes a connector that has a connection terminal that is connected to an outside, a press-fit terminal that is connected to the connection terminal, and a positioning protrusion that extends parallel to the press-fit terminal; a circuit substrate in which a terminal through hole into which the press-fit terminal is press-inserted and a first positioning through hole through which the positioning protrusion is inserted are formed, and a heat sink which has a first surface fixed to the circuit substrate, and a second surface disposed on an opposite side of the first surface and fixed to the connector, and in which a second positioning through hole through which the positioning protrusion is inserted is formed.

12 Claims, 7 Drawing Sheets

(58) Field of Classification Search
CPC .... H01R 12/7052; H01R 12/71; H02K 5/225; H02K 9/227; H05K 1/0203; H05K 2201/066; H05K 2201/10189
See application file for complete search history.

(56) References Cited

U.S. PATENT DOCUMENTS

| | | | | |
|---|---|---|---|---|
| 7,220,134 | B2* | 5/2007 | Goodman | H05K 7/1061 439/70 |
| 7,435,102 | B2* | 10/2008 | Goodman | H01R 13/2421 439/70 |
| 7,690,925 | B2* | 4/2010 | Goodman | H01R 13/2421 439/70 |
| 7,955,133 | B2* | 6/2011 | Scheele | H05K 7/026 361/752 |
| 9,107,331 | B2* | 8/2015 | Lo Presti | H05K 3/325 |
| 9,236,316 | B2* | 1/2016 | Fujino | H01L 24/36 |
| 9,543,802 | B2* | 1/2017 | Nakano | H02K 5/22 |
| 9,577,488 | B2* | 2/2017 | Sonoda | H02K 7/116 |
| 10,700,454 | B1* | 6/2020 | Blackburn | H01R 11/28 |
| 10,741,951 | B2* | 8/2020 | Mason | H01R 12/61 |
| 10,910,748 | B2* | 2/2021 | Mason | H05K 7/1069 |
| 11,929,660 | B2* | 3/2024 | Matsuda | H02K 3/50 |
| 11,970,220 | B2* | 4/2024 | Onishi | B62D 5/04 |
| 12,003,148 | B2* | 6/2024 | Tomita | H02K 11/33 |
| 12,003,168 | B2* | 6/2024 | Eguchi | H02K 5/04 |
| 12,218,018 | B2* | 2/2025 | Troska | H01L 23/562 |
| 12,308,544 | B2* | 5/2025 | Yamada | H01R 13/6587 |
| 2002/0182901 | A1* | 12/2002 | Koopman | H01R 13/2435 439/71 |
| 2006/0052011 | A1* | 3/2006 | Goodman | H01R 13/2421 439/700 |
| 2007/0082515 | A1* | 4/2007 | Goodman | H05K 7/1061 439/70 |
| 2009/0023311 | A1* | 1/2009 | Goodman | H01R 13/2421 439/66 |
| 2009/0195094 | A1* | 8/2009 | Oda | H02K 5/225 310/68 B |
| 2012/0320545 | A1* | 12/2012 | Lo Presti | H05K 7/14322 361/752 |
| 2013/0062137 | A1* | 3/2013 | Motoda | H02K 11/33 180/446 |
| 2013/0249356 | A1* | 9/2013 | Nakano | H02K 11/33 310/68 D |
| 2013/0334906 | A1* | 12/2013 | Sonoda | B62D 5/0406 310/43 |
| 2014/0035445 | A1* | 2/2014 | Uryu | H02K 11/33 310/68 D |
| 2015/0021750 | A1* | 1/2015 | Fujino | H01L 23/24 257/667 |
| 2019/0148858 | A1* | 5/2019 | Mason | H01R 13/111 439/67 |
| 2020/0195098 | A1 | 6/2020 | Shimakawa et al. | |
| 2020/0235501 | A1* | 7/2020 | Blackburn | H01R 11/28 |
| 2021/0237794 | A1* | 8/2021 | Onishi | B62D 5/04 |
| 2021/0272874 | A1* | 9/2021 | Spann | H01L 23/041 |
| 2022/0224195 | A1* | 7/2022 | Matsuda | H02K 9/227 |
| 2022/0224208 | A1* | 7/2022 | Tomita | H02K 5/225 |
| 2022/0247275 | A1* | 8/2022 | Eguchi | H02K 9/22 |
| 2022/0263381 | A1* | 8/2022 | Matsuda | H02K 9/227 |
| 2023/0335450 | A1* | 10/2023 | Fukuda | H01L 24/49 |
| 2023/0343661 | A1* | 10/2023 | Troska | H01L 21/56 |
| 2024/0079802 | A1* | 3/2024 | Dong | H01R 12/7064 |
| 2025/0046664 | A1* | 2/2025 | Tanikawa | H01L 23/48 |

FOREIGN PATENT DOCUMENTS

| | | | | |
|---|---|---|---|---|
| EP | 4336661 | A1 * | 3/2024 | ........... H01R 12/585 |
| JP | 2005-302614 | A | 10/2005 | |
| JP | 2007-066614 | A | 3/2007 | |
| JP | 5177711 | B2 * | 4/2013 | ........... H02K 11/33 |
| JP | 6658971 | B2 * | 3/2020 | ........... H02K 11/215 |
| JP | WO2018221726 | A1 * | 3/2020 | ........... H02K 11/215 |
| JP | 2020-080643 | A | 5/2020 | |
| KR | 20240034134 | A * | 3/2024 | ........... H01R 12/585 |
| KR | 20250054087 | A * | 4/2025 | ............... H02K 3/50 |
| WO | WO-2018221726 | A1 * | 12/2018 | ........... H02K 11/215 |
| WO | WO-2024069830 | A1 * | 4/2024 | ............... H02K 3/50 |

OTHER PUBLICATIONS

Japanese Office Action dated Jan. 23, 2024 in Application No. 2023-537801.

Extended European Search Report dated Aug. 7, 2024 in Application No. 21951807.3.

* cited by examiner

CIRCUIT CONNECTION DEVICE, ROTATING ELECTRIC MACHINE DEVICE, AND METHOD FOR MANUFACTURING CIRCUIT CONNECTION DEVICE

CROSS REFERENCE TO RELATED APPLICATIONS

This application is a National Stage of International Application No. PCT/JP2021/027830 filed Jul. 28, 2021.

TECHNICAL FIELD

The present disclosure relates to a circuit connection device, a rotating electric machine device, and a method for manufacturing a circuit connection device.

BACKGROUND ART

Conventionally, a circuit connection device having a circuit substrate and a connector is used as a control unit of a rotating electric machine device. Press-fit terminals may be used when connecting the circuit substrate and the connector. By press-inserting the press-fit terminals of the connector through terminal through holes of the circuit substrate, it is possible to insure that the circuit substrate and the connector are electrically connected, without the need to conduct any soldering or the like.

Conventionally, a heat sink is provided to cool down electronic components that are mounted on the circuit substrate. If the heat sink is provided between the circuit substrate and the connector, since the circuit substrate and the connector are apart from one another and a gap is formed therebetween, it is difficult to insert the press-fit terminals through the terminal through holes when the press-fit terminals are inserted through the terminal through holes. In Patent Document 1, to make an insertion of the press-fit terminals through the terminal through holes easier, a terminal alignment member is attached to the circuit substrate. Guide through holes that guide the press-fit terminals to the terminal through holes are formed in the terminal alignment member.

CITATION LIST

Patent Document

[Patent Document 1] Japanese Unexamined Patent Application, First Publication No. 2005-302614

SUMMARY OF INVENTION

Problem to be Solved by the Invention

In the construction of Patent Document 1, since there is a need to separately provide a terminal alignment member, a number of parts of a circuit connection device increases. Also, since a step of attaching the terminal alignment member to a circuit substrate is needed, manufacturing steps increase as well. As a result, product cost and manufacturing cost increase.

During assembling of the circuit connection device, in a case where a relative location of a connector and the circuit substrate greatly misalign from a standard location, there is a possibility that tips of press-fit terminals collide with guide through holes of the terminal alignment member and/or surroundings thereof. As a result, there is a possibility that the press-fit terminals buckle and so on, causing a decline in a quality of the circuit connection device.

The present disclosure has been made in order to address the problem above, and an object is to provide a circuit connection device, a rotating electric machine device, and a method for manufacturing a circuit connection device where with improved assemblability while preventing a rise in costs thereof.

Means to Solve the Problem

A circuit connection device according to the present disclosure includes a connector that has a connection terminal that is connected to an outside, a press-fit terminal that is connected to the connection terminal, and a positioning protrusion that extends parallel to the press-fit terminal: a circuit substrate in which a terminal through hole into which the press-fit terminal is press-inserted and a first positioning through hole through which the positioning protrusion is inserted are formed, and a heat sink which has a first surface fixed to the circuit substrate, and a second surface disposed on an opposite side of the first surface and fixed to the connector, and in which a second positioning through hole through which the positioning protrusion is inserted is formed.

A rotating electric machine device according to the present disclosure includes a rotating electric machine, and the circuit connection device that controls the rotating electric machine.

A manufacturing method of a circuit connection device according to the present disclosure that includes: a connector that has a connection terminal that is connected to an outside, a press-fit terminal that is connected to the connection terminal, and a positioning protrusion that extends parallel to the press-fit terminal; a circuit substrate in which a terminal through hole into which the press-fit terminal is press-inserted and a first positioning through hole through which the positioning protrusion is inserted are formed; and a heat sink which has a first surface fixed to the circuit substrate, and a second surface disposed on an opposite side of the first surface and fixed to the connector, and in which a second positioning through hole through which the positioning protrusion is inserted is formed, the manufacturing method comprising: a first step of fixing the connector to the heat sink, where the positioning protrusion is inserted through the second positioning through hole, and a second step of fixing the circuit substrate to the heat sink, where the positioning protrusion is inserted through the first positioning through hole and the press-fit terminal is press-inserted into the terminal through hole.

Effects of the Invention

According to the present disclosure, it is possible to provide a circuit connection device, a rotating electric machine device, and a method for manufacturing a circuit connection device with improved assemblability while preventing a rise in costs thereof.

DESCRIPTION OF EMBODIMENTS

First Embodiment

Hereinafter, a circuit connection device 2 and a rotating electric machine device 100 according to a first embodiment are explained with reference to the drawings.

Figure 1:
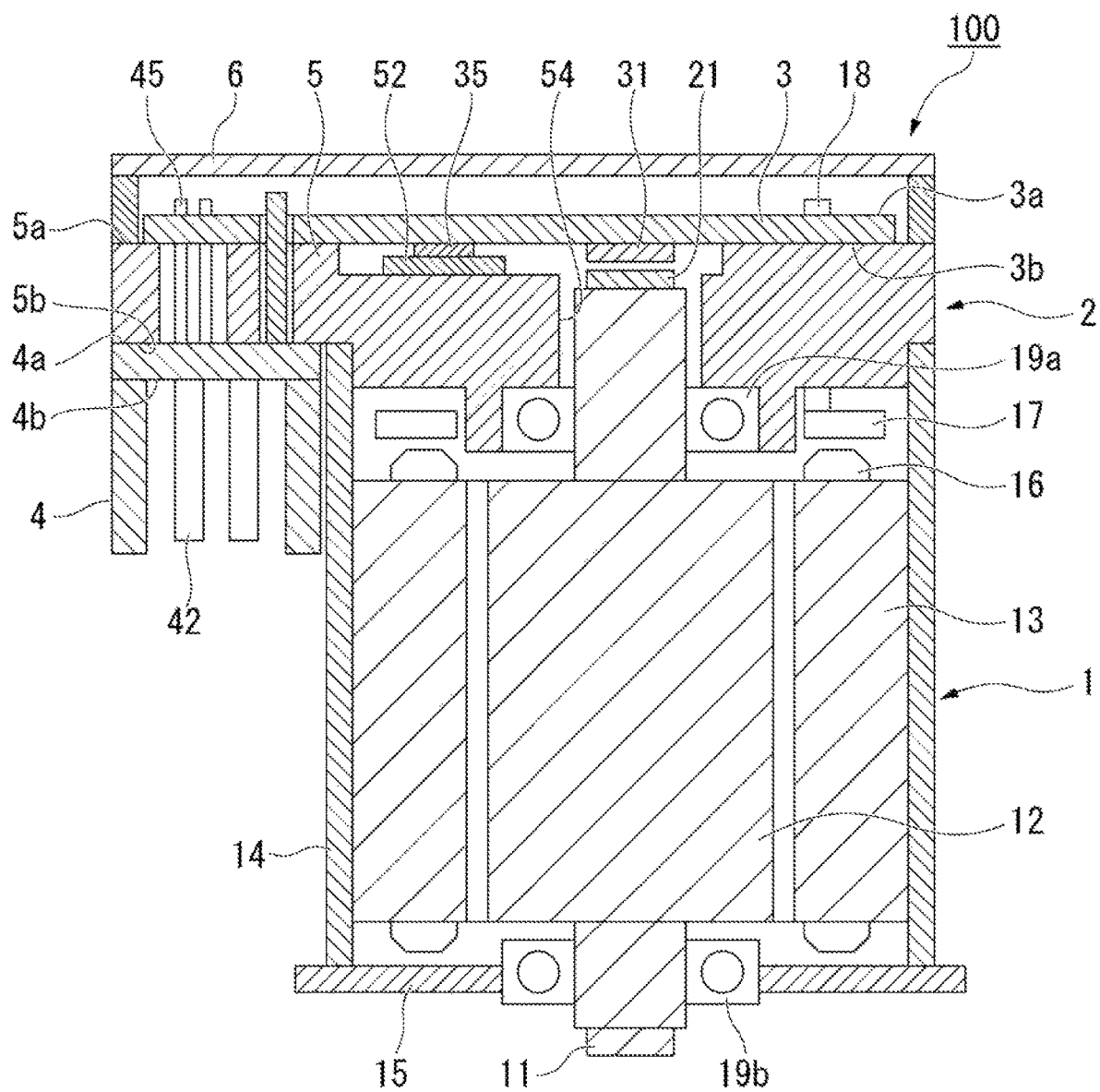
FIG. 1 A schematic cross-sectional view of a rotating electric machine device according to a first embodiment.

FIG. 1 is a schematic cross-sectional view of the rotating electric machine device 100. The rotating electric machine device 100 includes a multiphase winding type rotating electric machine 1, and a circuit connection device 2 to control the rotating electric machine 1.

The rotating electric machine 1 is mainly configured from a rotating shaft 11, a rotor 12, a stator 13, a case 14, a lid portion 15, windings 16, an annular wiring portion 17, wiring terminals 18, and a first and a second bearing 19a and 19b. FIG. 1 is a cross-sectional view of the rotating electric machine device 100 along the rotating shaft 11. In FIG. 1, a page bottom side is an output side of the rotating shaft 11. A page top side is an input side of the rotating shaft 11.

The rotating shaft 11 extends along an axis thereof. The rotor 12 is fixed to the rotating shaft 11. A plurality of permanent magnets (not shown) are disposed on an outer circumferential surface of the rotor 12. Such permanent magnets configure field poles.

The stator 13 is provided so as to surround an outer circumference of the rotor 12. The stator 13 is fixed to an inner surface of the case 14. An air gap is formed between the outer circumferential surface of the rotor 12 and an inner circumferential surface of the stator 13. The air gap is formed all around in a circumferential direction around the axis of the rotating shaft 11.

The case 14 is a cylindrical shape. The case 14 houses the rotating shaft 11, the rotor 12, and the stator 13. The lid portion 15 covers a bottom end of the case 14. An upper end of the case 14 is covered by a heat sink 5 of the circuit connection device 2 to be mentioned later on.

The windings 16 are wound around the stator 13. The windings 16 include U phase windings, V phase windings, and W phase windings.

The annular wiring portions 17 are disposed on a non-output side of the rotating shaft 11 (in other words, a top side in FIG. 1) with respect to the windings 16. The annular wiring portions 17 are connected to end portions of the windings 16 via TIG welding or the like.

The wiring terminals 18 are connected to the annular wiring portions 17. The wiring terminals 18 penetrate the heat sink 5 and extend toward the non-output side of the rotating shaft 11 from the annular wiring portions 17. The wiring terminals 18 are electrically connected to the end portions of the windings 16 via the annular wiring portions 17. The wiring terminals 18 are configured by three conductors. The three conductors are connected to wiring terminals of the U phase windings, wiring terminals of the V phase windings, and wiring terminals of W phase windings of the windings 16, respectively. The wiring terminals 18 are connected to a circuit substrate 3 of the circuit connection device 2 to be mentioned later on by soldering or the like.

A first bearing 19a is provided on an end portion (a top end portion in FIG. 1) of the non-output side of the rotating shaft 11. A second bearing 19b is provided on an end portion (a bottom end portion in FIG. 1) of the output side of the rotating shaft 11. The first bearing 19a and the second bearing 19b freely support the rotating shaft 11.

The first bearing 19a is fixed to the heat sink 5. The second bearing 19b is fixed to the lid portion 15.

A sensor rotor 21 is fixed to an end surface of the non-output side of the rotating shaft 11. The sensor rotor 21 rotates along with the rotating shaft 11. The sensor rotor 21 includes a single or a plurality of pairs of permanent magnets.

Figure 2:
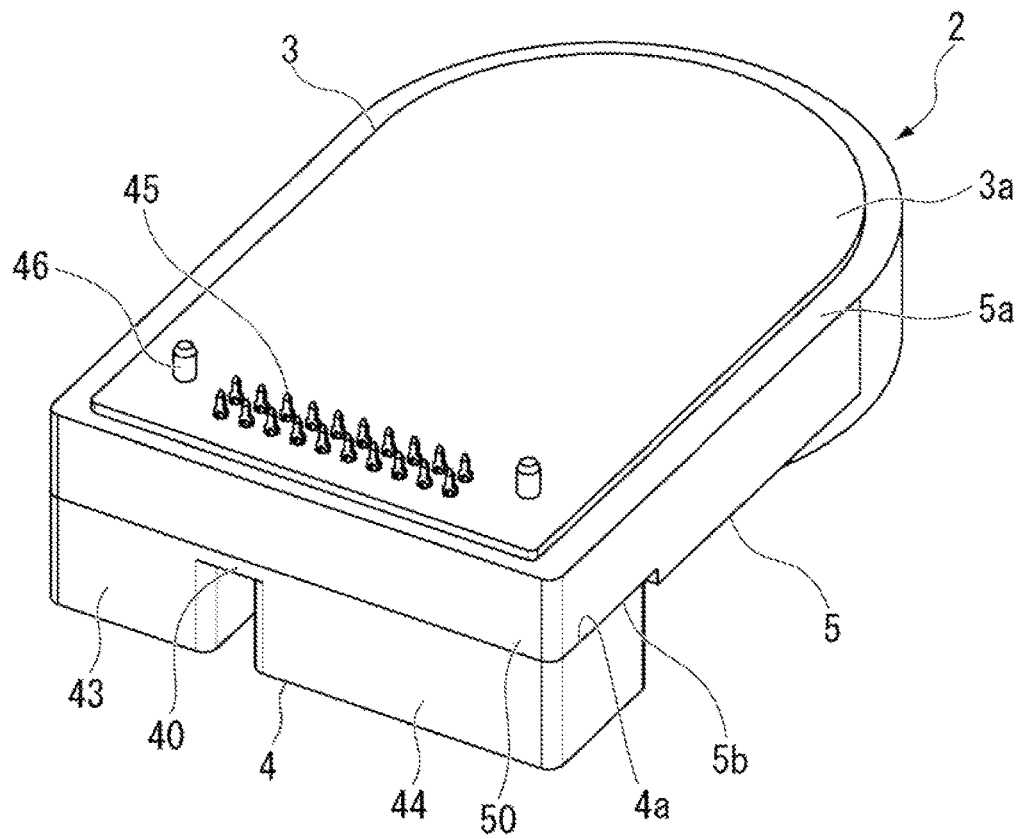
FIG. 2 A perspective view of a circuit connection device according to the first embodiment.

FIG. 2 is a perspective view of the circuit connection device 2 according to the first embodiment.

As shown in FIG. 1 and FIG. 2, the circuit connection device 2 has a circuit substrate 3, a connector 4, the heat sink 5 provided between the circuit substrate 3 and the connector 4, and a cover 6 that covers the circuit substrate 3 and the heat sink 5. FIG. 2 shows a state where the cover 6 is removed. In the present embodiment, the circuit connection device 2 is a control unit that controls current that flows to the windings 16 of the rotating electric machine 1.

Figure 3:
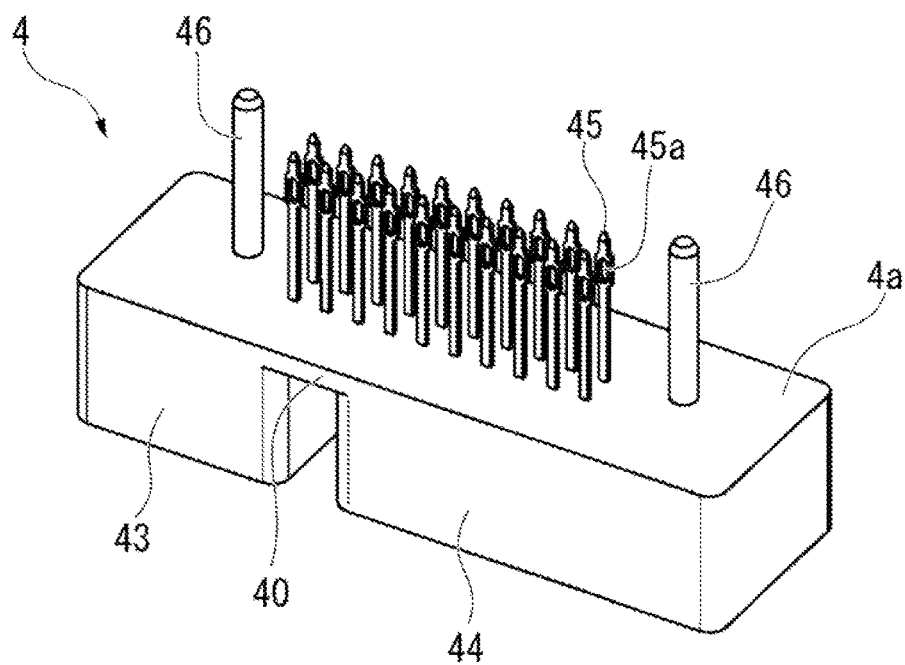
FIG. 3 A perspective view of a connector according to the first embodiment.
Figure 4:
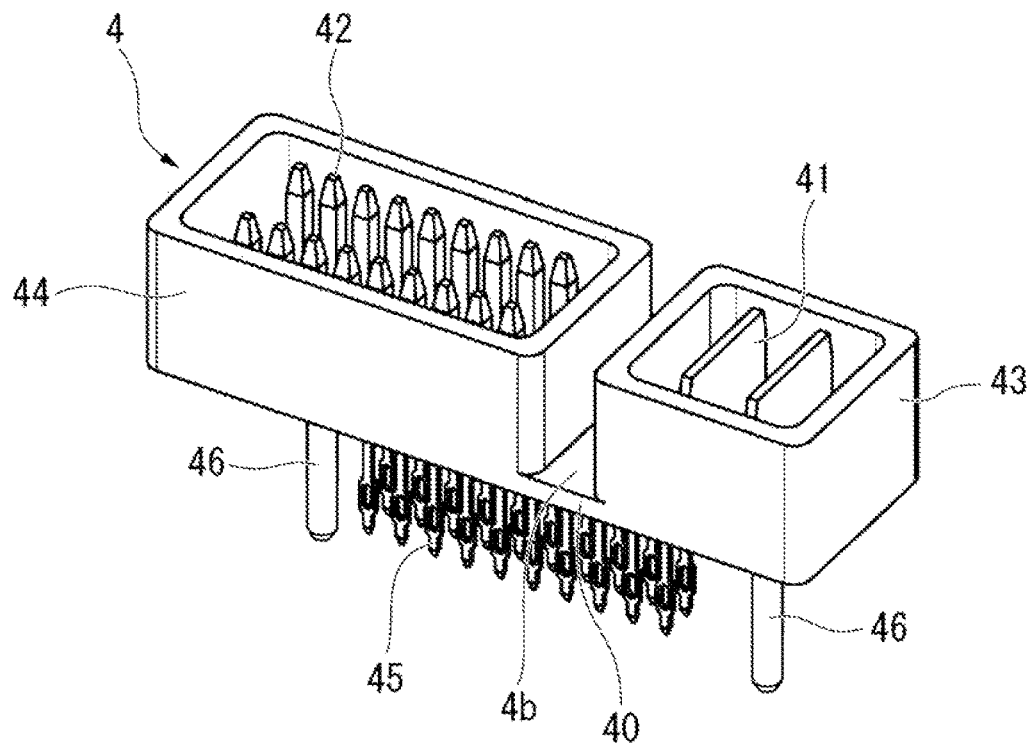
FIG. 4 A perspective view of the connector according to the first embodiment.

FIG. 3 and FIG. 4 are perspective views of the connector 4.

As shown in FIG. 3 and FIG. 4, the connector 4 includes a main body 40 having a first surface 4a and a second surface 4b, power terminals 41 (connection terminals), signal terminals 42 (connection terminals), a power supply side housing 43, a signal side housing 44, a plurality of press-fit terminals 45, and a pair of positioning protrusions 46. As shown in FIG. 1, the first surface 4a is a surface on a top side (the output side of the rotating shaft 11) of the connector 4. The second surface 4b is a surface on a bottom side (non-output side of the rotating shaft 11) of the connector 4. FIG. 3 is a view of the connector 4 as seen from the first surface 4a side. FIG. 4 is a view of the connector 4 as seen from the second surface 4b side.

The power terminals 41 and the signal terminals 42 protrude from the second surface 4b of the main body 40. The power terminals 41 are connected to an outside power supply (a battery). The signal terminals 42 are connected to outside sensors or the like. As shown in FIG. 1, the power terminals 41 and the signal terminals 42 extend towards the output side of the rotating shaft 11.

In the present embodiment, although shapes of the power terminals 41 and the signal terminals 42 differ, the power terminals 41 and the signal terminals 42 may use the same shape as a shape thereof. Three or more types of shapes of terminals may be used as the power terminals 41 and the signal terminals 42.

Although the power terminals 41 and the signal terminals 42 extend towards the output side of the rotating shaft 11, the power terminals 41 and the signal terminals 42 may extend to the non-output side of the rotating shaft 11.

The power supply side housing 43 is provided on the second surface 4b of the main body 40. The power supply side housing 43 is a container that has an opening, and which houses the power terminals 41 on an inside of the opening. The power supply side housing 43 is integrally formed with the main body 40.

The signal side housing 44 is provided on the second surface 4b of the main body 40. The signal side housing 44 is a container that has an opening, and which houses the signal terminals 42 on an inside of the opening. The signal side housing 44 is integrally formed with the main body 40.

In the present embodiment, although the power supply side housing 43 and the signal side housing 44 are containers that are separate from one another, the power supply side housing 43 and the signal side housing 44 may be formed as a single container. The power supply side housing 43 and the signal side housing 44 may be formed of three or more containers. In other words, the power terminals 41 and the signal terminals 42 may be housed in a single container, or may be separated and housed in three or more containers.

The plurality of press-fit terminals 45 are provided so as to each of corresponding power terminals 41 and corresponding signal terminals 42. The press-fit terminals 45 are connected to the corresponding power terminals 41 or the corresponding signal terminals 42. The press-fit terminals 45 extend from the corresponding power terminals 41 or from the corresponding signal terminals 42, and protrude from the first surface 4a of the main body 40. As shown in FIG. 1 and FIG. 2, the press-fit terminals 45 extend towards the circuit substrate 3. The press-fit terminals 45 extend towards the non-output side of the rotating shaft 11.

In the present embodiment, although the press-fit terminals 45 extend in a direction that is an opposite side of an extension direction of the power terminals 41 and the signal terminals 42, the press-fit terminals 45 may extend in a direction that is orthogonal to the extension direction of the power terminals 41 and the signal terminals 42.

The press-fit terminals 45 are formed overall as a thin long flat plate. Press-fit portions 45a are formed on tip end portions of the press-fit terminals 45. A width (maximum width) of the press-fit portions 45a is larger than a width of any other portion of the press-fit terminals 45. Holes are formed in the press-fit portions 45a, and it is possible for the press-fit portions 45a to elastically deform due to such holes.

The positioning protrusions 46 protrude from the first surface 4a of the main body 40. The positioning protrusions 46 are roughly formed as cylindrical shapes overall. Tapered surfaces are provided on tip end portions of the positioning protrusions 46. In other words, the tip end portions of the positioning protrusions 46 are tapered surfaces that taper towards the tip ends of the positioning protrusions 46.

The positioning protrusions 46 extend in parallel with the press-fit terminals 45. The pair of positioning protrusions 46 are provided so as to sandwich the plurality of press-fit terminals 45. A length (in other words, a length of a portion out of portions of the positioning protrusions 46 that protrudes from the first surface 4a) of the positioning protrusions 46 is longer than a length (in other words, a length of a portion out of portions of the press-fit terminals 45 that protrudes from the first surface 4a) of the press-fit terminals 45. Therefore, the positioning protrusions 46 protrude towards a top direction more than tip ends of the press-fit terminals 45.

Figure 5:
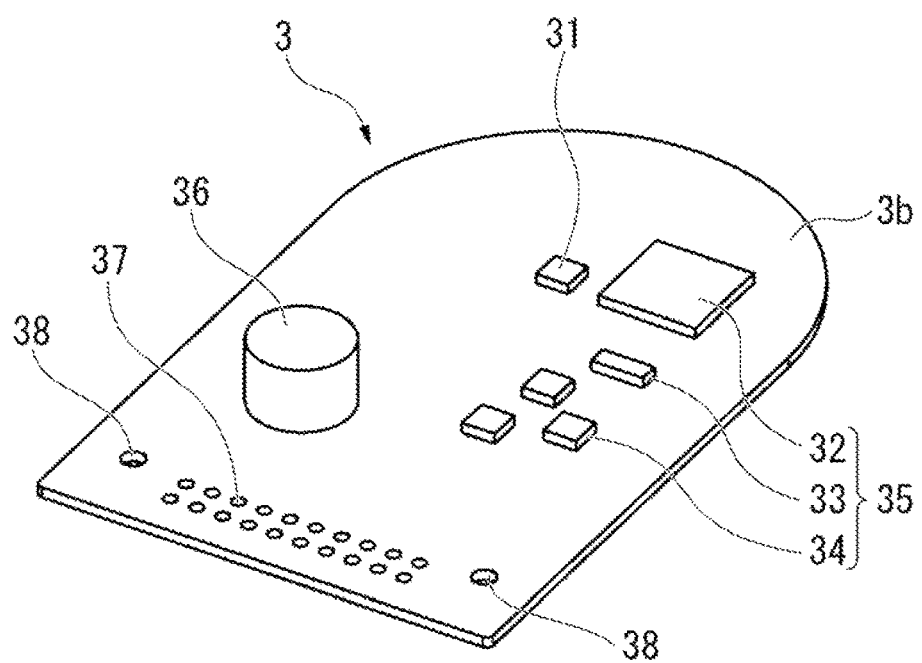
FIG. 5 A perspective view of a circuit substrate according to the first embodiment.

FIG. 5 is a perspective view of the circuit substrate 3.

As shown in FIG. 1 and in FIG. 5, the circuit substrate 3 has a first surface 3a and a second surface 3b. The first surface 3a is a surface on the top side (the output side of the rotating shaft 11) of the circuit substrate 3. The second surface 3b is a surface on the bottom side (the non-output side of the rotating shaft 11) of the circuit substrate 3. The FIG. 5 is a view of the circuit substrate 3 as seen from the second surface 3b side.

The circuit substrate 3 is a printed wiring board. A rotation sensor 31, a microcomputer 32, a shunt resistor 33, small electronic components such as switching elements 34 or the like, and large electronic components such as a smoothing capacitor 36 or the like are mounted on the second surface 3b of the circuit substrate 3. The microcomputer 32, the shunt resistor 33 and the switching elements 34 are heat generating electronic components. The microcomputer 32, the shunt resistor 33, and the switching elements 34 are collectively referred to as "heating components 35".

The rotation sensor 31 is a magnetic sensor. As shown in FIG. 1, the rotation sensor 31 is disposed on the same axis as the sensor rotor 21 which is provided on the end surface of the non-output side of the rotating shaft 11. The sensor rotor 21 and the rotation sensor 31 face one another via a gap. The rotation sensor 31 detects changes in a magnetic field of the permanent magnets of the sensor rotor 21 that rotate with the rotating shaft 11, and convert the changes thereof to electrical signals. A rotational state of the rotating shaft 11 is detected by the sensor rotor 21 and the rotation sensor 31. As the rotation sensor 31, a resolver, a hall-effect sensor, an optical sensor or the like may be used.

Going back to FIG. 5, a plurality of terminal through holes 37 are formed on the circuit substrate 3. Terminal through holes 37 are through holes that penetrate the circuit substrate 3 from the first surface 3a to the second surface 3b. The plurality of terminal through holes 37 are provided at locations that correspond to the plurality of press-fit terminals 45. Inner diameters of the terminal through holes 37 are smaller than widths (maximum width) of the press-fit portions 45a. The plurality of press-fit terminals 45 are each press-inserted into the plurality of terminal through holes 37.

A conductive layer is formed on an inner surface of the terminal through holes 37. By press-inserting the press-fit terminals 45 into the terminal through holes 37, the press-fit terminals 45 contact the conductive layer of the inner surface of the terminal through holes 37, and are therefore electrically connected. By using the press-fit terminals 45, it is possible to electrically connect the circuit substrate 3 and the connector 4 without conducting any soldering or the like. Therefore, manufacturing of the circuit connection device 2 becomes easier, and it is possible to reduce manufacturing time thereof.

A pair of first positioning through holes 38 is formed on the circuit substrate 3. The first positioning through holes 38 penetrate the circuit substrate 3 from the first surface 3a to the second surface 3b. The pair of first positioning through holes 38 are provided so as to sandwich the plurality of terminal through holes 37. The first positioning through holes 38 are provided in locations that correspond to the positioning protrusions 46. The first positioning through holes 38 and the positioning protrusions 46 are disposed on the same axis. The positioning protrusions 46 are inserted through the first positioning through holes 38. Outer diameters of the positioning protrusions 46 are slightly smaller than inner diameters of the first positioning through holes 38.

Figure 6:
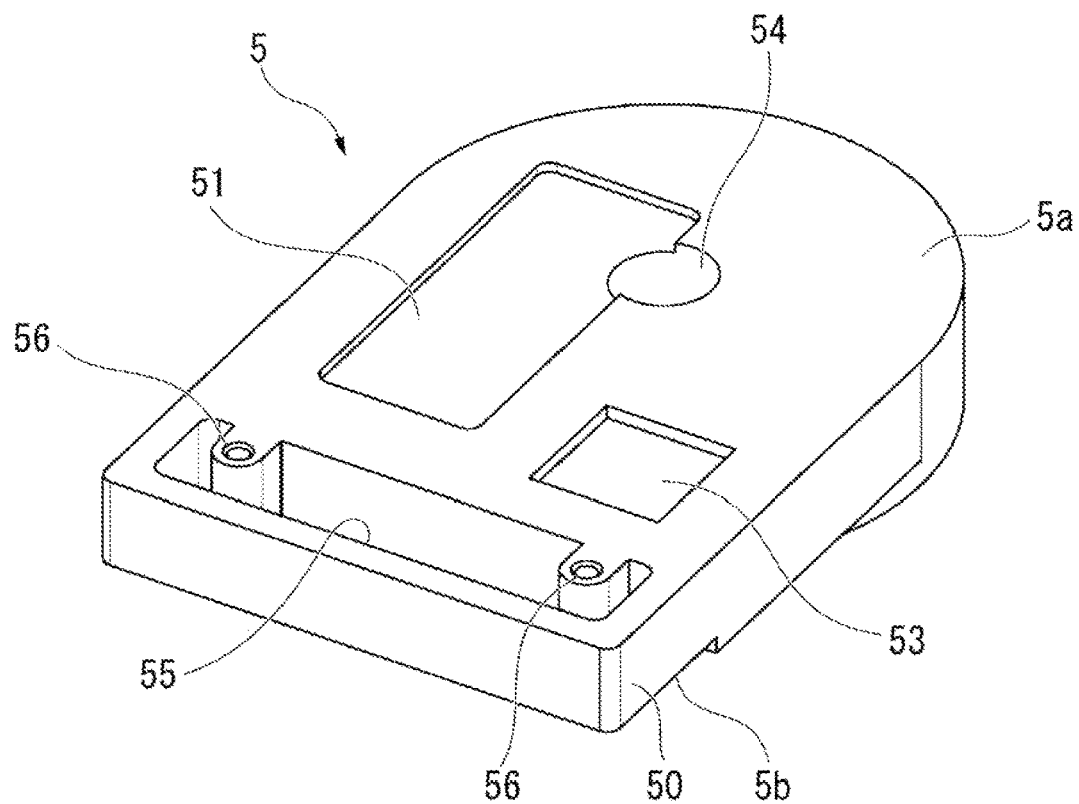
FIG. 6 A perspective view of a heat sink according to the first embodiment.

FIG. 6 is a perspective view of the heat sink 5.

As shown in FIG. 6, the heat sink 5 has a main body 50 having a first surface 5a and a second surface 5b, a heat dissipating portion 51, a large component storage portion 53, a rotating shaft through hole 54, an opening 55, and a pair of second positioning through holes 56. As is shown in FIG. 1, the first surface 5a is a surface located on the top side (the output side of the rotating shaft 11) of the heat sink 5. The second surface 5b is a surface located on the bottom side (the non-output side of the rotating shaft 11) of the heat sink 5. FIG. 6 is a view of the heat sink 5 as seen from the first surface 5a side.

As shown in FIG. 1, the heat sink 5 covers a top end of the case 14. The heat sink 5 serves as a lid that covers an inside of the rotating electric machine 1. The circuit substrate 3 is attached onto the first surface 5a of the heat sink 5. The connector 4 is attached to the second surface 5b of the heat sink 5.

Going back to FIG. 6, the heat dissipating portion 51 is a recessed portion that is provided on the first surface 5a of the main body 50. The heat dissipating portion 51 is provided in a location that corresponds to the location of the heating components 35 that are mounted on the circuit substrate 3. Heat dissipating grease 52 (refer to FIG. 1) is applied to the heat dissipating portion 51. When the circuit substrate 3 is attached to the heat sink 5, the heating components 35 are fully covered with the heat dissipating grease 52. As such, heat of the heating components 35 is dissipate to the heat sink 5 via the heat dissipating grease 52.

The large component storage portion 53 is a recessed portion that is provided on the first surface 5a of the main body 50. The large component storage portion 53 is provided in a location that corresponds to the location the large electronic components such as the smoothing capacitor 36 or the like that are mounted on the circuit substrate 3. By providing the large component storage portion 53, it is possible to prevent the heat sink 5 from colliding with the large electronic components such as the smoothing capacitor 36 or the like.

The rotating shaft through hole 54 penetrates the main body 50 from the first surface 5a to the second surface 5b. As shown in FIG. 1, the rotating shaft through hole 54 is provided in a location that corresponds to the location of the rotating shaft 11. The end portion of the non-output side of the rotating shaft 11 is inserted through the rotating shaft through hole 54. The first bearing 19a is disposed inside the rotating shaft through hole 54. The sensor rotor 21 and the rotation sensor 31 face one another inside the rotating shaft through hole 54, and it is possible for the sensor rotor 21 and the rotation sensor 31 to detect the rotational state of the rotating shaft 11.

The opening 55 penetrates the main body 50 from the first surface 5a to the second surface 5b. The opening 55 is provided in a location that corresponds to the location of the plurality of press-fit terminals 45. The plurality of press-fit terminals 45 are inserted through the opening 55. By providing the opening 55, it is possible to prevent the heat sink 5 from colliding with the plurality of press-fit terminals 45.

The second positioning through holes 56 penetrate the main body 50 from the first surface 5a to the second surface 5b. The pair of the second positioning through holes 56 are provided so as to sandwich the opening 55. The second positioning through holes 56 are provided in locations that correspond to the locations of the positioning protrusions 46 of the connector 4. The second positioning through holes 56 and the positioning protrusions 46 are disposed on the same axis. In other words, the positioning protrusions 46, the first positioning through holes 38, and the second positioning through holes 56 are disposed on the same axis. The positioning protrusions 46 are inserted through the second positioning through holes 56. Outer diameter of the positioning protrusions 46 are slightly smaller than inner diameters of the second positioning through holes 56.

A height (in other words, a length of the main body 50 from the first surface 5a to the second surface 5b) of the main body 50 is shorter than lengths of the positioning protrusions 46. The height of the main body 50 is shorter than lengths of the press-fit terminals 45. Therefore, when the connector 4 is attached to the heat sink 5, the positioning protrusions 46 and the press-fit terminals 45 are inserted through the second positioning through holes 56 and the opening 55 respectively, protruding from the main body 50.

Figure 7:
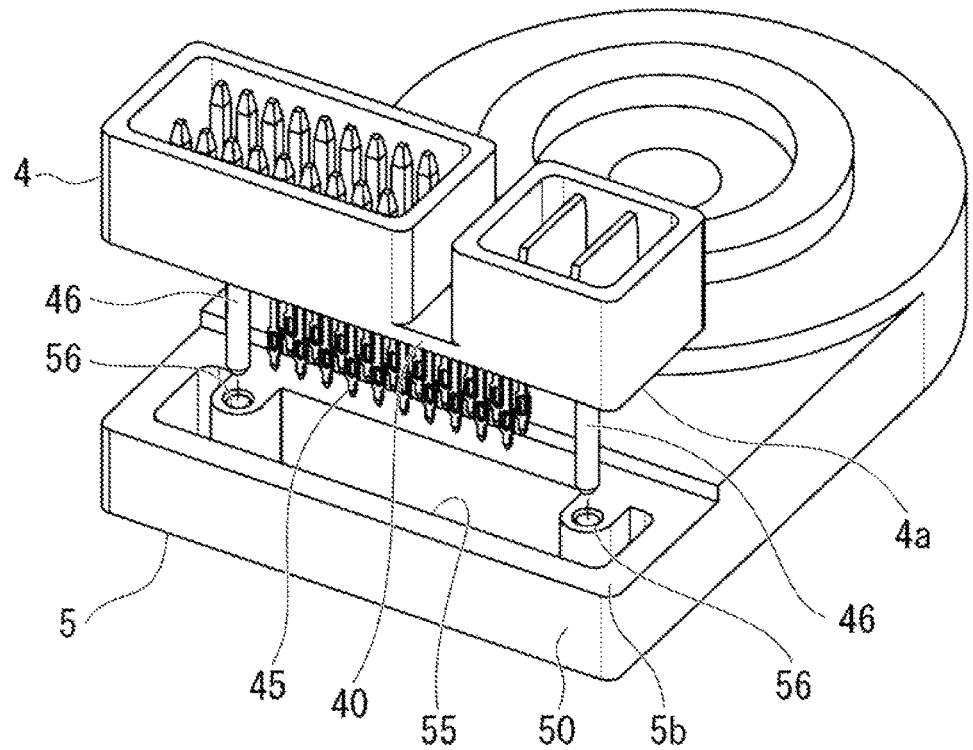
FIG. 7 A view that explains a first step of a manufacturing method of the circuit connection device according to the first embodiment.
Figure 8:
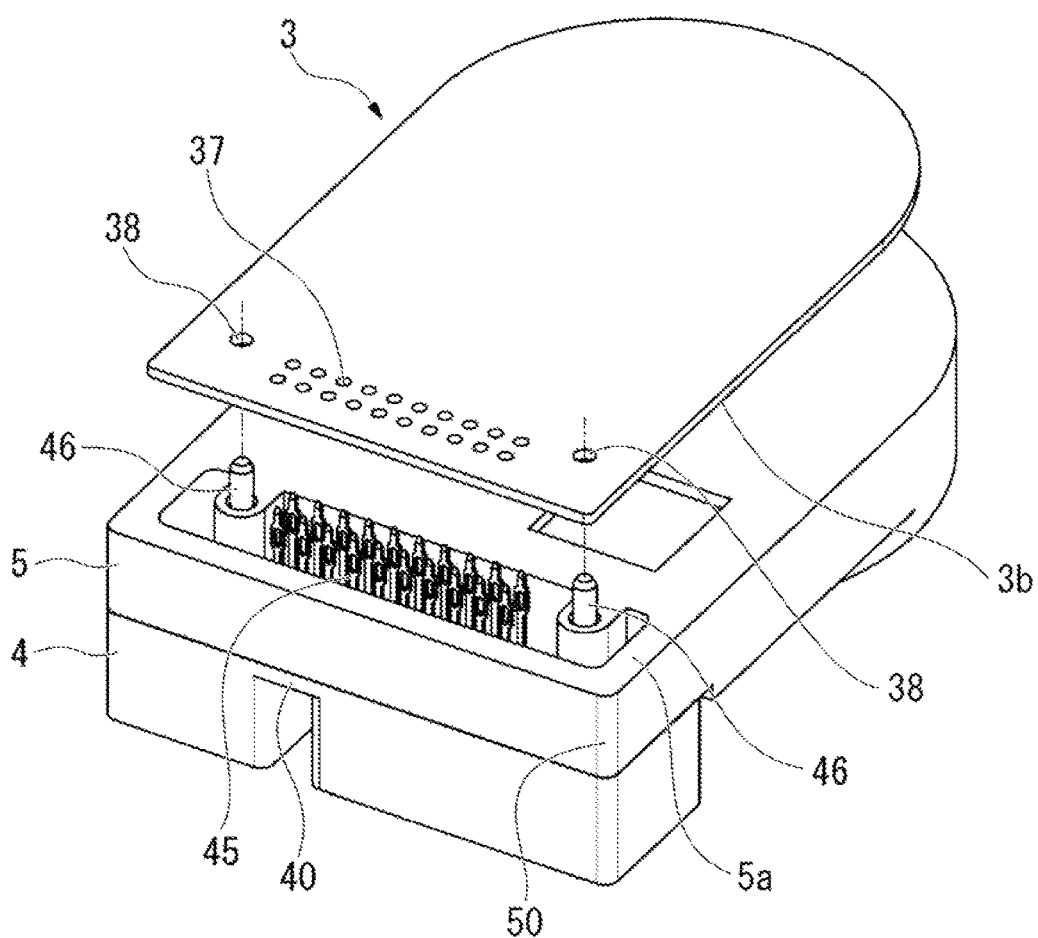
FIG. 8 A view that explains a second step of the manufacturing method of the circuit connection device according to the first embodiment.
Figure 9:
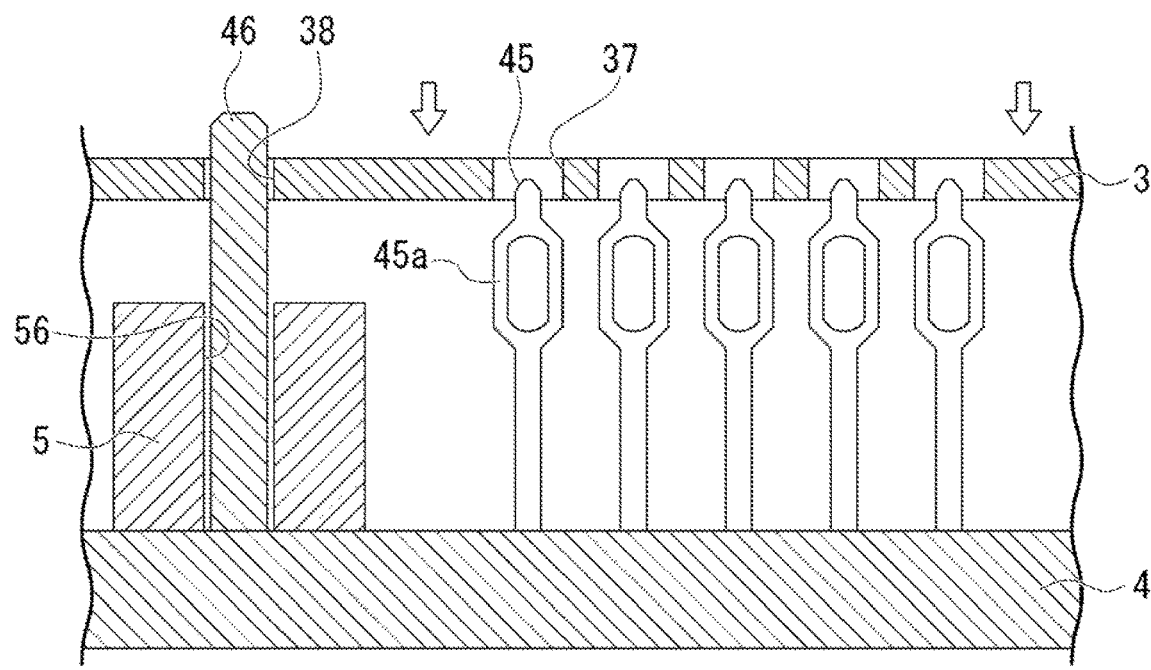
FIG. 9 A view that explains the second step of the manufacturing method of the circuit connection device according to the first embodiment.

Next, a manufacturing method of the circuit connection device 2 according to the first embodiment is explained using FIG. 7 to FIG. 9. The manufacturing method of the circuit connection device 2 includes a first step of attaching the connector 4 to the heat sink 5, and a second step of attaching the circuit substrate 3 to the heat sink 5. In the explanation below, a direction along a surface that is vertical with respect to the extension direction (in other words, the extension direction of the positioning protrusions 46) of the press-fit terminals 45 is referred to as a horizontal direction.

FIG. 7 is a view that explains the first step.

In the first step, the heat sink 5 is first disposed so that the second surface 5b of the main body 50 becomes the top side. The connector 4 is disposed so as that the second surface 5b of the main body 50 and the first surface 4a of the main body 40 face one another. The positioning protrusions 46 of the connector 4 are inserted through the second positioning through holes 56 of the heat sink 5. Since the tip end portions of the positioning protrusions 46 are tapered, it is possible to smoothly insert the positioning protrusions 46 through the second positioning through holes 56. At such time, the plurality of press-fit terminals 45 are inserted into the opening 55. By having the positioning protrusions 46 insert through the second positioning through holes 56, it is possible to adjust a position in the horizontal direction of the connector 4 with respect to the heat sink 5. Since the outer diameters of the positioning protrusions 46 are slightly smaller than the inner diameters of the second positioning through holes 56, gaps form between the positioning protrusions 46 and the second positioning through holes 56. Afterwards, the connector 4 is fixed to the heat sink 5 by thread fastening.

FIG. 8 and FIG. 9 are views that explain the second step.

In the second step, the connector 4 and the heat sink 5 that were fixed to one another in the first step are inverted in a top bottom direction. In other words, the connector 4 and the heat sink 5 are disposed in such a way so as to have the first surface 5a of the main body 50 be the top side. The circuit substrate 3 is disposed so as to have the first surface 5a of the main body 50 and the second surface 3b of the circuit substrate 3 face one another. The positioning protrusions 46 of the connector 4 are inserted into the first positioning through holes 38 of the circuit substrate 3. Since the tip end portions of the positioning protrusions 46 are tapered, it is possible to smoothly insert the positioning protrusions 46 through the first positioning through holes 38. By having the positioning protrusions 46 insert through the first positioning through holes 38, it is possible to adjust locations in the horizontal direction of the circuit substrate 3 with respect to the connector 4 and the heat sink 5. As such, it is possible have centers of the press-fit terminals 45 and centers of the terminal through holes 37 coincide with one another by aligning the locations in the horizontal direction of the press-fit terminals 45 and the terminal through holes 37. It is possible to have the heat dissipating portion 51 (heat dissipating grease 52) and the heating components 35 face one another by aligning the locations in the horizontal direction of the heat dissipating portion 51 (heat dissipating grease 52) and the heating components 35. It is possible to have the large component storage portion 53 and the smoothing capacitor 36 face one another by aligning the position in the horizontal direction of the large component storage portion 53 and the smoothing capacitor 36. It is possible to align the horizontal locations of the rotating shaft through hole 54 and the rotation sensor 31 so as to suppress misalignment of the rotation sensor 31, making it is possible to accurately detect the rotational state of the rotating shaft 11.

In such a state, the circuit substrate 3 is moved more towards the heat sink 5 side, and the press-fit terminals 45 are inserted into the terminal through holes 37.

As shown in FIG. 9, the positioning protrusions 46 protrude in the top direction more than the tip ends of the press-fit terminals 45. Therefore, at a stage where inserting the positioning protrusions 46 through the first positioning through holes 38 has started, insertion of the press-fit terminals 45 through the terminal through holes 37 has not started. In other words, it is possible to insert the press-fit terminals 45 into the terminal through holes 37 after the locations in the horizontal direction of the press-fit terminals 45 and the terminal through holes 37 are aligned by having the positioning protrusions 46 inserted through the first positioning through holes 38. Therefore, it is possible to assuredly and smoothly insert the press-fit terminals 45 into the terminal through holes 37.

Afterwards, a load is applied to the circuit substrate 3 in a direction (direction shown with an arrow in FIG. 9) orthogonal to the first surface 3a of the circuit substrate 3, and the circuit substrate 3 is pressed onto the heat sink 5. As such, the press-fit terminals 45 are press-inserted through and fixed to the terminal through holes 37. At such time, the heat dissipating grease 52 applied to the heat dissipating portion 51 of the heat sink 5 is spread out, and the heating components 35 are fully covered with the heat dissipating grease 52. Since it is possible to spread out the heat dissipating grease 52 when press-fitting the press-fit terminals 45, it is possible to simplify the assembly process. The smoothing capacitor 36 is disposed inside of the large component storage portion 53. The rotation sensor 31 is disposed inside of the rotating shaft through hole 54.

In a state where the circuit substrate 3 is pressed against the heat sink 5, the circuit substrate 3 is fixed to the heat sink 5 by thread fastening. Fixing of the circuit substrate 3 to the heat sink 5 is not limited to thread fastening, and the fixing may be fixing by an adhesive, fixing by welding, fixing by brazing, fixing by soldering, or fixing by crimping or the like.

As explained above, in the circuit connection device 2 according to the present embodiment, the connector 4 has the power terminals 41 and the signal terminals 42 that are connected to the outside, the press-fit terminals 45 connected to the power terminals 41 and the signal terminals 42, and the positioning protrusions 46 that extend parallel to the press-fit terminals 45. The terminal through holes 37 to which the press-fit terminals 45 are press-inserted, and the first positioning through holes 38 through which the positioning protrusions 46 are inserted are formed on the circuit substrate 3. The circuit substrate 3 is fixed to the first surface 5a of the heat sink 5. The connector 4 is fixed to the second surface 5b, a surface on an opposite side of the first surface 5a. The second positioning through holes 56, through which the positioning protrusions 46 are inserted, are formed on the heat sink 5.

The manufacturing method of the circuit connection device 2 according to the present embodiment includes a first step of inserting the positioning protrusions 46 through the second positioning through holes 56, and of fixing the connector 4 to the heat sink 5, and a second step of inserting the positioning protrusions 46 through the first positioning through holes 38, of press-fitting the press-fit terminals 45 to the terminal through holes 37, and of fixing the circuit substrate 3 to the heat sink 5.

By inserting the positioning protrusion 46 through the second positioning through hole 56 and the first positioning through hole 38, it is possible to adjust the relative locations of the circuit substrate 3, the connector 4 and the heat sink 5. Therefore, it is possible to accurately and easily assemble the connector 4 to the heat sink 5, and it is possible to accurately and easily assemble the circuit substrate 3 to the heat sink 5. By having the positioning protrusion 46 inserted through the first positioning through hole 38, it is possible to assuredly insert the press-fit terminal 45 into the terminal through hole 37 in a state where the press-fit terminal 45 is aligned with the terminal through hole 37. Therefore, the assemblability of the circuit connection device 2 is improved. Since there is no need to separately provide a component for positioning the press-fit terminal 45, it is possible suppress increases in manufacturing costs and in product costs.

As is described above, according to the circuit connection device 2 of the present embodiment, it is possible to suppress increase in costs while improving assemblability.

It is also possible to prevent the tip end of the press-fit terminal 45 from colliding with the terminal through hole 37 and/or surroundings thereof. As a result, it is possible to prevent buckling of the press-fit terminal 45 and/or damaging of the circuit substrate 3. It is also possible to prevent short circuiting or the like that results from deterioration of electrical insulation of the circuit substrate 3 that results from damages to the circuit substrate 3. Therefore, it is possible to provide a high quality circuit connection device 2.

The heat sink 5 also includes the opening 55 through which the press-fit terminal 45 is inserted. As such, it is possible to prevent collision between the heat sink 5 and the press-fit terminal 45.

A length of the positioning protrusion 46 is longer than a length of the press-fit terminal 45. As such, before the press-fit terminal 45 is inserted into the terminal through hole 37, the positioning protrusion 46 is inserted into the first positioning through hole 38, and it is possible to align locations of the press-fit terminal 45 and the terminal through hole 37. As a result, it is possible to assuredly and smoothly insert the press-fit terminal 45 into the terminal through hole 37.

The pair of the positioning protrusions 46 are provided so as to sandwich the press-fit terminal 45. As such, it is possible to accurately align the locations of the press-fit terminal 45 and the terminal through hole 37.

Second Embodiment

Hereinafter, the circuit connection device 2 according to a second embodiment is explained with reference to the drawings. Components having similar functions and effects as components in the first embodiment have the same reference signs affixed thereto, and explanations thereof are omitted.

Figure 10:
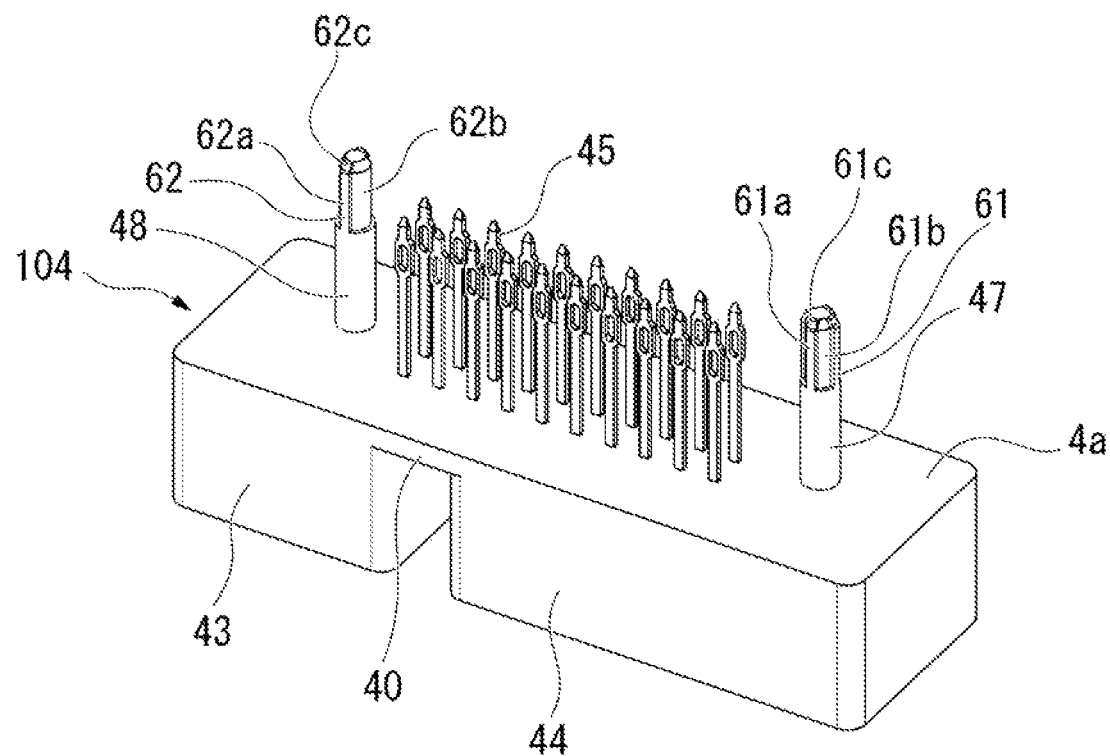
FIG. 10 A perspective view of the connector according to a second embodiment.
Figure 11:
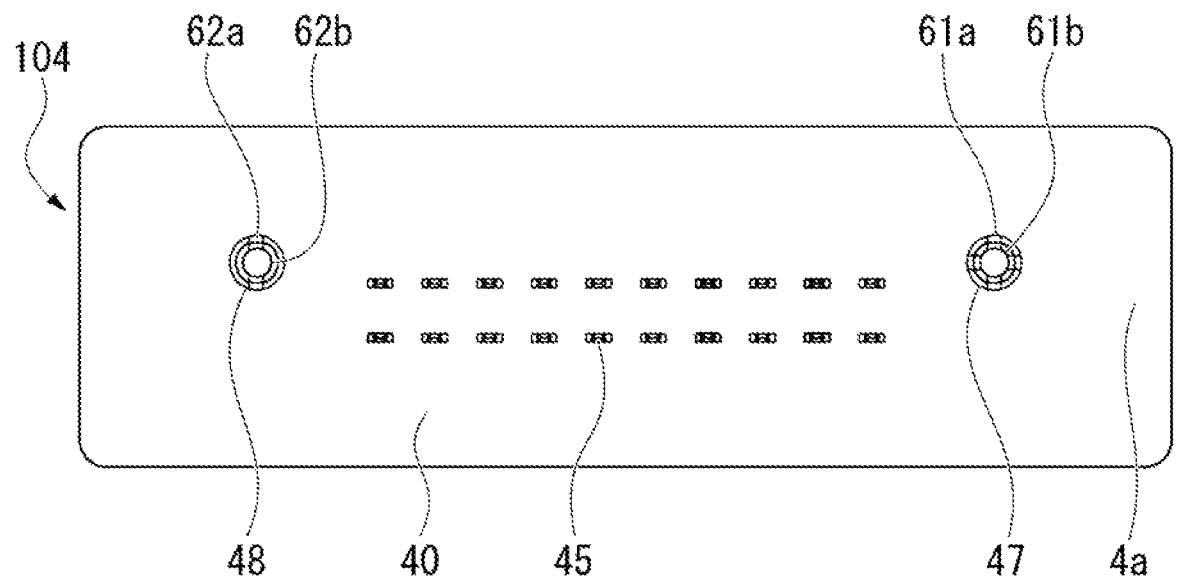
FIG. 11 A plan view of the connector according to the second embodiment.

FIG. 10 is a perspective view of a connector 104 of the circuit connection device 2 according to the second embodiment. FIG. 11 is a plan view of the connector 104.

The connector 104 according to the second embodiment has a first positioning protrusion 47 and a second positioning protrusion 48 instead of the pair of positioning protrusions 46.

A first rib portion 61 that is press-inserted into a hole of the first positioning through holes 38 of the circuit substrate 3 is provided on a tip end portion of the first positioning protrusion 47.

The first rib portion 61 has a cylindrical column 61b, and a plurality (four in the present embodiment) of ribs 61a that protrude from the column 61b. The plurality of ribs 61a are disposed in a circumferential direction of the column 61b at equal intervals (90 degrees in the present embodiment). The ribs 61a extend parallel to an axis of the column 61b. The ribs 61a are provided over the entire length of the column 61b. Tapered surfaces 61c that taper towards a tip of the first positioning protrusion 47 are provided on tip end portions of the ribs 61a. In other words, the tip end portions of the ribs 61a are tapered surfaces that taper towards the tip ends of the first positioning protrusion 47. A maximum diameter of the first rib portion 61 (in other words, an outer diameter of a portion of the first rib portion 61 where the ribs 61a are provided) is larger than the inner diameters of the first positioning through holes 38.

On a tip end portion of the second positioning protrusion 48, a second rib portion 62 that is press-inserted into a hole of the first positioning through holes 38 is provided.

The second rib portion 62 has a cylindrical column 62b, and a plurality (two in the present embodiment) of ribs 62a that protrude from the column 62b. The plurality of ribs 62a are disposed in a circumferential direction of the column 62b at equal intervals (180 degrees in the present embodiment). The ribs 62a extend parallel to an axis of the column 62b. The ribs 62a are provided over the entire length of the column 62b. Tapered surfaces 62c that taper towards a tip of the second positioning protrusion 48 are provided on tip end portions of the ribs 62a. In other words, the tip end portions of the ribs 62a are tapered surfaces that taper towards the tip ends of the second positioning protrusion 48. A maximum diameter of the second rib portion 62 (in other words, an outer diameter of a portion of the second rib portion 62 where the ribs 62a are provided) is larger than the inner diameters of the first positioning through holes 38.

Next, a manufacturing method of the circuit connection device 2 according to the second embodiment is explained. Similar to the first embodiment, the manufacturing method of the circuit connection device 2 according to the second embodiment includes a first step of attaching the connector 104 to the heat sink 5, and a second step of attaching the circuit substrate 3 to the heat sink 5.

The first step in the second embodiment is the same as the first step in the first embodiment. In other words, in the first step, the heat sink 5 is disposed so that the second surface 5b of the main body 50 is the top side. The connector 104 is disposed so that the second surface 5b of the main body 50 and the first surface 4a of the main body 40 face one another. The first and second positioning protrusions 47 and 48 of the connector 104 are inserted through the second positioning through holes 56 of the heat sink 5. Afterwards, the connector 104 is fixed to the heat sink 5 by thread fastening.

In the second step, the heat sink 5 is disposed so that the first surface 5a of the main body 50 is the top side. The circuit substrate 3 is disposed so that the first surface 5a of the main body 50 and the second surface 3b of the circuit substrate 3 face one another. The first and second positioning protrusions 47 and 48 of the connector 104 are inserted through the first positioning through holes 38 of the circuit substrate 3. By inserting the first and second positioning protrusions 47 and 48 through the first positioning through holes 38, a location in the horizontal direction of the circuit substrate 3 with respect to the connector 104 and the heat sink 5 is adjusted.

In the present embodiment, the first rib portion 61 having four of the ribs 61a is provided on the tip end portion of the first positioning protrusion 47. The second rib portion 62 having two of the ribs 62a is provided on the tip end portion of the second positioning protrusion 48. By inserting the first rib portion 61 through a hole of the first positioning through holes 38, variations in the location in the horizontal direction of the circuit substrate 3 with respect to the connector 104 and the heat sink 5 are restricted. By inserting the second rib portion 62 through the other hole of the first positioning through holes 38, rotation of the circuit substrate 3 with respect to the connector 104 and the heat sink 5 about the first positioning protrusion 47 as a rotation axis is restricted.

Afterwards, the circuit substrate 3 is moved more towards the heat sink 5, and the press-fit terminals 45 of the connector 104 are inserted into the terminal through holes 37 of the circuit substrate 3. A load is applied to the circuit substrate 3 in a direction orthogonal to the first surface 3a of the circuit substrate 3, and the circuit substrate 3 is pressed onto the heat sink 5. As such, the press-fit terminals 45 are inserted through and fixed to the terminal through holes 37. The first rib portion 61 and second rib portion 62 are press-inserted through and fixed to the first positioning through holes 38. Afterwards, in a state where the circuit substrate 3 is pressed against the heat sink 5, the circuit substrate 3 is fixed to the heat sink 5 by thread fastening.

Since the number of the ribs 62a of the second rib portion 62 is less than the number of the ribs 61a of the first rib portion 61, the circuit substrate 3 is not completely fixed to the connector 104 by the second rib portion 62 and the first positioning through holes 38. In other words, play is generated between the second rib portion 62 and the first positioning through holes 38. As such, even if misalignments in locations between the first positioning protrusion 47, the second positioning protrusion 48, and the first positioning through holes 38 are generated, it is possible to prevent the circuit substrate 3 from coming off.

The maximum diameter of the first rib portion 61 and the maximum diameter of the second rib portion 62 are greater than the inner diameters of the first positioning through holes 38. Therefore, the first positioning protrusion 47 and the second positioning protrusion 48 are temporarily disposed on an inside of the first positioning through holes 38, and it is possible to confirm the relative locations with the press-fit terminals 45 and the terminal through holes 37 from first surface 3a side of the circuit substrate 3. Therefore, it is possible to assuredly prevent misalignment in the locations of the press-fit terminals 45 and the terminal through holes 37.

The tip end portions of the plurality of ribs 61a are tapered surfaces that taper towards the tip ends of the first positioning protrusion 47. The tip end portions of the plurality of ribs 62a are tapered surfaces that taper towards the tip ends of the second positioning protrusion 48. As such, it is possible to insert the first positioning protrusion 47 and the second positioning protrusion 48 into the second positioning through holes 56 and the first positioning through holes 38. Also, when press-inserting the first positioning protrusion 47 and the second positioning protrusion 48 into the first positioning through holes 38, even if the ribs 61a or the ribs 62a are shaved off, it is possible to prevent foreign objects thereof from being generated.

The above mentioned various embodiments may be combined, and it is possible to alter or omit the above mentioned various embodiments where appropriate.

For example, in the embodiments above, a load is applied to the circuit substrate 3, and the press-fit terminals 45 are press-inserted and fixed into the terminal through holes 37 by pressing the circuit substrate 3 against the heat sink 5. However, depending on the type of the press-fit terminals 45, by applying axial pressure to the press-fit terminals 45 from the tip ends of the press-fit terminals 45 to make widths of the press-fit portions 45a larger, the press-fit terminals 45 may be crimped to the terminal through holes 37.

In the embodiments above, electronic components are mounted on the first surface 3a of the circuit substrate 3, which is a surface on the output side of the rotating shaft 11. The present disclosure however, is not limited thereto, and the electronic components may be mounted on the second surface 3b, which is a surface on the non-output side of the rotating shaft 11. The heat dissipating grease 52 is not only applied between the heating components 35 and the heat dissipating portion 51, but may also be filled between the entirety of the circuit substrate 3 and the heat sink 5.

Figure 12:
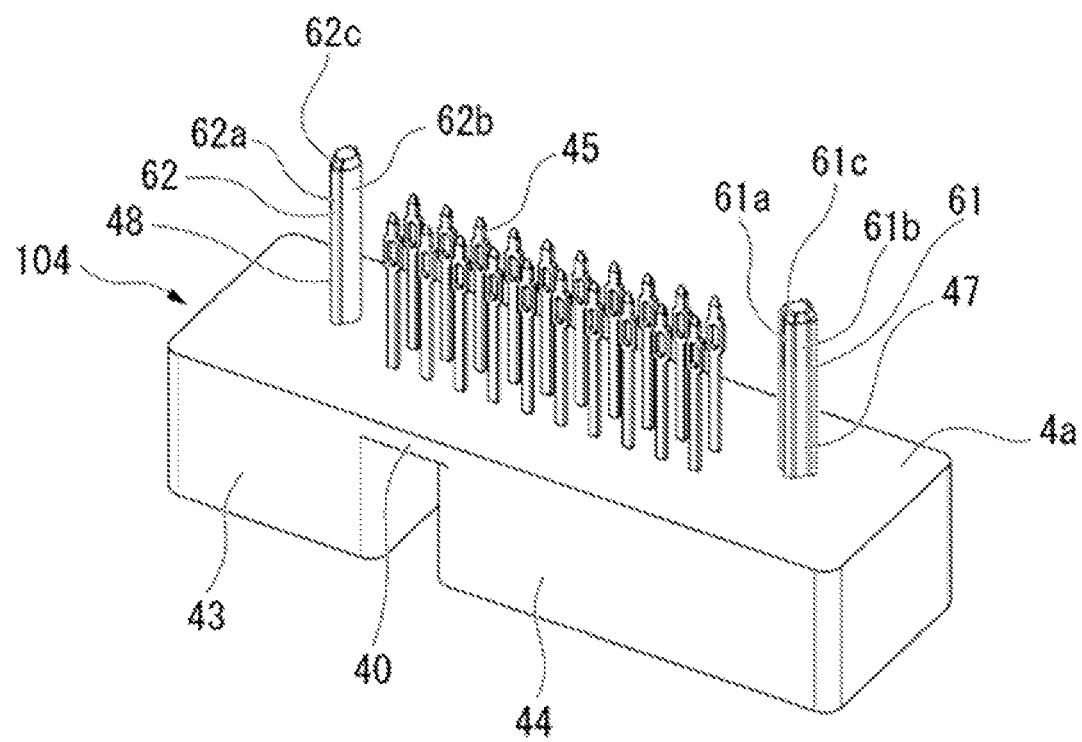
FIG. 12 A perspective view of a modified example of the connector according to the second embodiment.

In the second embodiment, the first rib portion 61 may be provided on the overall length of the first positioning protrusion 47, as shown in FIG. 12. The second rib portion 62 may be provided on the overall length of the second positioning protrusion 48 as shown in FIG. 12. In this case, the first rib portion 61 and the second rib portion 62 may be press-inserted and fixed to both the second positioning through holes 56 of the heat sink 5, and the first positioning through holes 38 of the circuit substrate 3.

The number of the plurality of ribs 61a is not limited to four, and the number of the plurality of ribs 62a is not limited to two. Numbers of the plurality of ribs 61a and the plurality of ribs 62a may be the same.

The circuit connection device 2 is not limited to the rotating electric machine device 100, and may be applied to an inverter device, a DC-DC inverter device, and a microcomputer application control device or the like.

REFERENCE SIGNS LIST

1 . . . Rotating Electric Machine 2 . . . Circuit Connection Device 3 . . . Circuit Substrate 4, 104 . . . Connector 5 . . . Heat Sink 37 . . . Terminal Through Hole 38 . . . First Positioning Through Hole 41 . . . Power Terminal (Connection Terminal) 42 . . . Signal Terminal (Connection Terminal) 45 . . . Press-Fit Terminal 46 . . . Positioning Protrusion 47 . . . Positioning Protrusion (First Positioning Protrusion) 48 . . . Positioning Protrusion (Second Positioning Protrusion) 55 . . . Opening 56 . . . Second Positioning Through Hole 61 . . . First Rib Portion 61a . . . Rib (First Rib) 61b . . . Column (First Column) 62 . . . Second Rib Portion 62a . . . Rib (Second Rib) 62b . . . Column (Second Column) 100 . . . Rotating Electric Machine Device

The invention claimed is:

1. A circuit connection device comprising:
a connector that has a connection terminal that is connected to an outside, a press-fit terminal that is connected to the connection terminal, and a positioning protrusion that extends parallel to the press-fit terminal;
a circuit substrate in which a terminal through hole into which the press-fit terminal is press-inserted and a first positioning through hole through which the positioning protrusion is inserted are formed, and
a heat sink which has a first surface fixed to the circuit substrate, and a second surface disposed on an opposite side of the first surface and fixed to the connector, and in which a second positioning through hole through which the positioning protrusion is inserted is formed.

2. The circuit connection device according to claim 1, wherein the heat sink has an opening through which the press-fit terminal is inserted.

3. The circuit connection device according to claim 1, wherein
a length of the positioning protrusion is longer than a length of the press-fit terminal.

4. The circuit connection device according to claim 1, wherein
the positioning protrusion includes a first positioning protrusion and a second positioning protrusion that are provided so as to sandwich the press-fit terminal.

5. The circuit connection device according to claim 4, wherein
the first positioning protrusion has a first rib portion that includes a first column and a plurality of first ribs that protrude from the first column,
the second positioning protrusion has a second rib portion that includes a second column and a plurality of second ribs that protrude from the second column, and
a number of the plurality of second ribs is less than a number of the plurality of first ribs.

6. The circuit connection device according to claim 5, wherein
the first rib portion is provided on a tip end portion of the first positioning protrusion, and the second rib portion is provided on a tip end portion of the second positioning protrusion.

7. The circuit connection device according to claim 5, wherein
the first rib portion is provided on the overall length of the first positioning protrusion, and the second rib portion is provided on the overall length of the second positioning protrusion.

8. The circuit connection device according to claim 5, wherein
tip end portions of the plurality of first ribs are tapered surfaces that taper towards a tip end of the first positioning protrusion, and tip end portions of the plurality of second ribs are tapered surfaces that taper towards a tip end of the second positioning protrusion.

9. The circuit connection device according to claim 1, wherein
the circuit substrate is thread fastened to the heat sink.

10. The circuit connection device according to claim 1, wherein
the connector is thread fastened to the heat sink.

11. A rotating electric machine device comprising:
a rotating electric machine, and
the circuit connection device according to claim 1 that controls the rotating electric machine.

12. A manufacturing method of a circuit connection device that includes: a connector that has a connection terminal that is connected to an outside, a press-fit terminal that is connected to the connection terminal, and a positioning protrusion that extends parallel to the press-fit terminal; a circuit substrate in which a terminal through hole into which the press-fit terminal is press-inserted and a first positioning through hole through which the positioning protrusion is inserted are formed; and a heat sink which has a first surface fixed to the circuit substrate, and a second surface disposed on an opposite side of the first surface and fixed to the connector, and in which a second positioning through hole through which the positioning protrusion is inserted is formed, the manufacturing method comprising:
a first step of fixing the connector to the heat sink, where the positioning protrusion is inserted through the second positioning through hole, and
a second step of fixing the circuit substrate to the heat sink, where the positioning protrusion is inserted through the first positioning through hole and the press-fit terminal is press-inserted into the terminal through hole.

* * * * *